United States Patent
Uematsu et al.

(10) Patent No.: US 12,519,445 B2
(45) Date of Patent: Jan. 6, 2026

(54) SIGNAL TRANSMISSION SYSTEM

(71) Applicant: Hitachi Astemo, Ltd., Hitachinaka (JP)

(72) Inventors: Yutaka Uematsu, Tokyo (JP); Toshiaki Takai, Hitachinaka (JP); Masashi Saito, Hitachinaka (JP); Masayoshi Takahashi, Tokyo (JP)

(73) Assignee: Hitachi Astemo, Ltd., Hitachinaka (JP)

( * ) Notice: Subject to any disclaimer, the term of this patent is extended or adjusted under 35 U.S.C. 154(b) by 94 days.

(21) Appl. No.: 18/698,317

(22) PCT Filed: Oct. 18, 2022

(86) PCT No.: PCT/JP2022/038719
§ 371 (c)(1),
(2) Date: Apr. 3, 2024

(87) PCT Pub. No.: WO2023/090028
PCT Pub. Date: May 25, 2023

(65) Prior Publication Data
US 2024/0429890 A1    Dec. 26, 2024

(30) Foreign Application Priority Data

Nov. 16, 2021    (JP) .................................. 2021-186652

(51) Int. Cl.
*H03H 7/00* (2006.01)
*H01P 3/02* (2006.01)

(52) U.S. Cl.
CPC ............... *H03H 7/004* (2013.01); *H01P 3/02* (2013.01)

(58) Field of Classification Search
CPC ......... H05K 1/025; H05K 2201/09727; H05K 1/0225; H05K 1/0245; H05K 1/0253;
(Continued)

(56) References Cited

U.S. PATENT DOCUMENTS 6,310,527 B1    10/2001    Sugawara et al.
6,965,285 B2    11/2005    Hirabayashi
(Continued)

FOREIGN PATENT DOCUMENTS

EP          0 926 932 B1       12/2003
JP          2003-092501 A       3/2003
(Continued)

OTHER PUBLICATIONS

International Search Report and Written Opinion with English translations for PCT/JP2022/038719, dated Jan. 10, 2023, 11 pages.
(Continued)

*Primary Examiner* — Lincoln D Donovan
*Assistant Examiner* — Tyler J Pereny
(74) *Attorney, Agent, or Firm* — Foley & Lardner LLP

(57) ABSTRACT

A signal transmission system includes: a first signal line and a second signal line each making up a differential line; a first capacitive load mechanism disposed in a first region connected to the first signal line, the first capacitive load mechanism having a first capacitance value; and a second capacitive load mechanism disposed in a second region connected to the second signal line and to the ground point line, the second capacitive load mechanism having a capacitance value asymmetric with the first capacitance value. This signal transmission system suppresses an increase in mode conversion loss caused by component characteristics variations.

12 Claims, 12 Drawing Sheets

(58) Field of Classification Search
CPC ......... H05K 1/147; H05K 2201/09272; H05K 2201/09281; H05K 2201/10189; H05K 1/0231; H05K 1/162; H01P 3/085; H01P 3/06; H01P 3/082; H01P 1/18; H01P 1/184; H03H 7/427; H03H 7/38; H03H 2001/0085; H03H 7/1708; H03H 7/19; H04L 25/0266; H04L 25/0272; H04L 25/0276; H04L 25/028; H04L 25/0278
See application file for complete search history.

(56) References Cited

U.S. PATENT DOCUMENTS

| | | | |
|---|---|---|---|
| 10,594,519 | B2 | 3/2020 | Bhagwat |
| 2003/0052752 | A1 | 3/2003 | Hirabayashi |
| 2005/0088256 | A1* | 4/2005 | Gottlieb ............ H02M 3/33576 333/181 |
| 2006/0066417 | A1 | 3/2006 | Yamanaga et al. |
| 2007/0268272 | A1* | 11/2007 | Perski ................... G06F 3/0446 345/173 |
| 2011/0279935 | A1 | 11/2011 | Iwasa et al. |
| 2021/0337658 | A1 | 10/2021 | Sakai et al. |

FOREIGN PATENT DOCUMENTS

| | | |
|---|---|---|
| JP | 2006-005798 A | 1/2006 |
| JP | 2022-119716 A | 8/2022 |
| WO | WO-2015/132958 A1 | 9/2015 |

OTHER PUBLICATIONS

Extended European Search Report issued in corresponding EP patent application No. 22895314.7, mailed Sep. 29, 2025, 11 pages.

\* cited by examiner

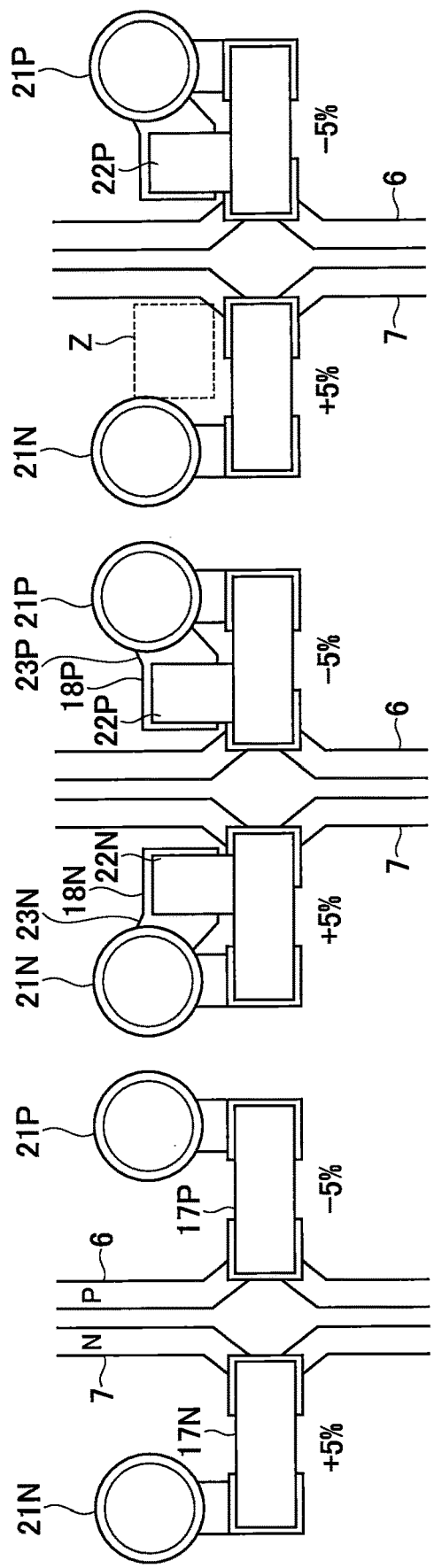

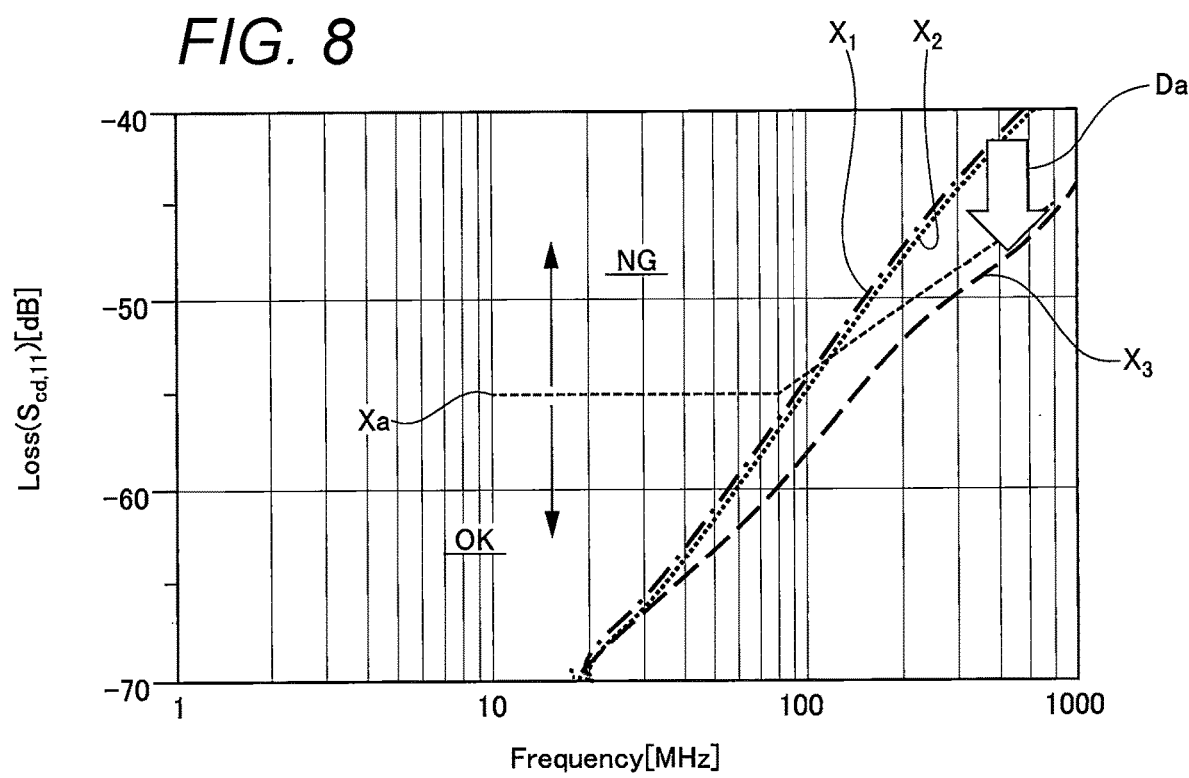

SIGNAL TRANSMISSION SYSTEM

TECHNICAL FIELD

The present invention relates to a signal transmission system.

BACKGROUND ART

In recent years, high-speed signal transmission using a twisted-pair cable has been advanced in the field of signal transmission between devices incorporated in vehicles. For example, while 100BASE-T1 allowing a transmission rate of 100 Mbps was the main stream of in-vehicle Ethernet protocols for long years, advanced Ethernet protocols ranging from 1000 BASE-T1 allowing a transmission rate of 1 Gbps or higher to multi-gigabit Ethernet and 25 G BASE-T1 have been developed lately.

Such high-speed signal transmission using an in-vehicle cable, however, poses a challenge of maintaining EMC performance in high-frequency signal transmission. Because a current spectrum used for signal transmission is so high in frequency level as to exceed the GHz band, suppressing radiation in such a high frequency band becomes necessary for maintaining EMC performance. At the same time, because a communication LSI has high sensitivity allowing reception of a signal with a frequency reaching the GHz band, GHz band noises' sneaking in the signal must also be suppressed.

However, in a pair of (positive and negative) signal lines making up a differential transmission path, electrical characteristics variations caused by various factors disturb differential balance. As a result, the differential transmission path cannot offer its advantage of differential transmission, which leads to lower EMC performance. A degree of characteristics variations in these differential lines is defined as a mode conversion loss, and is used as a criterion for EMC performance particularly in a high frequency range of 100 MHz or higher.

This represents, in the differential lines, an amount of a differential mode being converted into a common mode or an amount of a common mode being converted into a differential mode. When the mode conversion loss is large, an unintended common mode component is generated, which results in an increase in radiation noise, or a common mode component is converted into a differential mode component, which results in a drop in noise resistance. In the following description, a positive (P)-side transmission path and a negative (N)-side transmission path making up the differential transmission path will be referred to as P and N, respectively.

PTL 1 discloses a system in which electronic devices are connected through a twisted-pair cable and a differential signal and supplied power that are superimposed in the twisted-pair cable are transmitted through the twisted-pair cable. In this system, a DC cut-off capacitor is disposed on a signal line, and a filter element, such as a common mode choke coil or an inductor, is disposed on a power supply line, as PoDL filters. In this configuration, the signal and the supplied power are separated from each other according to frequency ranges of the filter elements.

In signal transmission by the differential method, the P-side transmission path and the N-side transmission path making up the differential transmission path are, ideally, set symmetrical. In this symmetrical configuration, a magnetic field generated by a current flowing through each line can be canceled by a reverse phase current, which allows suppression of radiation. In addition, when noises commonly applied to both signal lines (common mode noise) are superimposed, such noises can be canceled by a differential receiver, which improves resistance to external noise.

CITATION LIST

Patent Literature

PTL 1: U.S. Pat. No. 10,594,519

SUMMARY OF INVENTION

Technical Problem

According to the technique described in PTL 1, by disposing the filter element between a communication circuit and the twisted-pair cable, common mode noise leakage from a circuit on a wiring board to the twisted-pair cable can be reduced. Furthermore, according to the technique described in PTL 1, propagation of common mode noise picked up by the twisted-pair cable to the circuit on the wiring board can be suppressed.

However, in such a differential transmission path, when variations in the characteristics of components making up a transmission system arise and electrical characteristics imbalance results between P and N, a mode conversion loss of the transmission path increases to drop EMC performance, which is a problem. Particularly, in a high frequency range, variations in parasitic capacitances of the components contribute to an increase in the mode conversion loss, causing the EMC performance to drop further. It should be noted that the mode conversion loss is expressed by an Scd value in a Mixed Mode S-Parameter matrix.

An object of the present invention is to provide a signal transmission system that can suppress an increase in a mode conversion loss caused by variations in component characteristics.

Solution to Problem

In order to solve the above problem, for example, a configuration described in the claims is adopted.

The present invention includes a plurality of means for solving the above problem, and a signal transmission system of the present invention is one example of these means. The signal transmission system includes: a first signal line and a second signal line each making up a differential line; a first capacitive load mechanism disposed in a first region connected to the first signal line, the first capacitive load mechanism having a first capacitance value; and a second capacitive load mechanism disposed in a second region connected to the second signal line, the second capacitive load mechanism having a second capacitance value asymmetric with the first capacitance value.

Advantageous Effects of Invention

According to the present invention, an increase in a mode conversion loss caused by variations in component characteristics can be suppressed.

Problems, configurations, and effects that are not described above will be made clear by the following description of embodiments.

BRIEF DESCRIPTION OF DRAWINGS

FIGS. 7A, 7B, and 7C are explanatory diagrams of three examples of balance adjustment according to the second embodiment of the present invention.

FIG. 8 is a characteristic graph showing an effect achieved by the second embodiment of the present invention.

DESCRIPTION OF EMBODIMENTS

Figure 1:
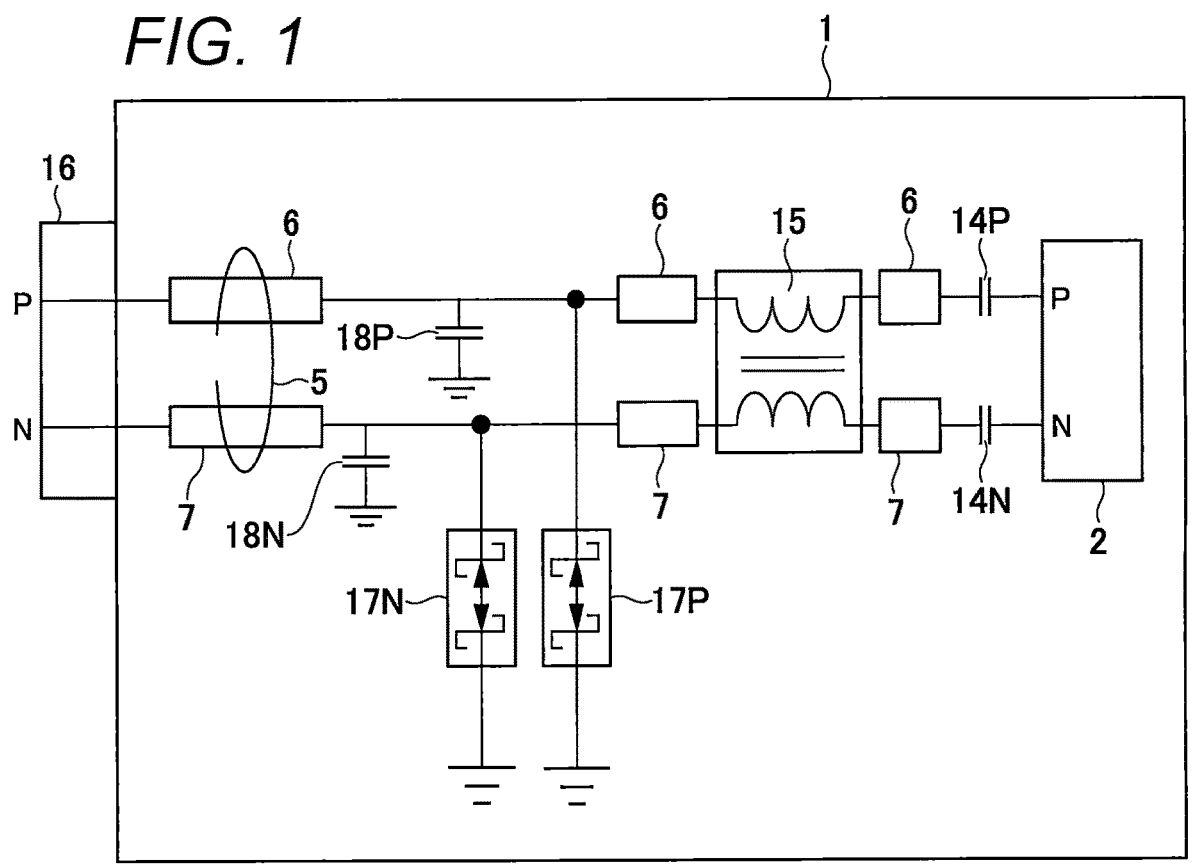
FIG. 1 is a configuration diagram showing an electronic device of a signal transmission system according to a first embodiment of the present invention.

Embodiments of a signal transmission system according to the present invention will hereinafter be described with reference to the drawings. The following description and drawings are exemplary one for explaining the embodiments of the present invention and will be omitted or simplified when necessary to make the explanation clear. The present invention may be implemented in various forms other than the embodiments. Unless otherwise specified, each constituent element may be provided as a single constituent element and as a plurality of constituent elements as well.

In the drawings, the positions, sizes, shapes, ranges, and the like of constituent elements are shown in simplified forms to facilitate understanding of the invention and therefore may not represent the actual positions, sizes, shapes, ranges, and the like of the constituent elements. For this reason, the present invention is not necessarily limited by positions, sizes, shapes, ranges, and the like shown in the drawings. In addition, the same parts of each embodiment are denoted by the same reference signs, and redundant description of the same parts of each embodiment will be omitted.

First Embodiment

FIG. 1 depicts a configuration of an electronic device 1 with a signal transmission system according to a first embodiment of the present invention.

The electronic device 1 shown in FIG. 1 includes a communication LSI 2 built therein for communicating with an external different electronic device.

The electronic device 1 includes a cable connector 16 to which a cable (not illustrated) is connected. The electronic device 1 is thus connected to the external different electronic device via the cable. Signal transmission is performed between the communication LSI (Large Scale Integration) 2 and the external different electronic device.

The communication LSI 2 is connected to the cable connector 16 via a differential line 5 laid out on a printed circuit board. The differential line 5 is composed of a pair of a P-side signal line 6 and an N-side signal line 7. Between the communication LSI 2 and the cable connector 16, AC coupling capacitors 14P and 14N for cutting off DC voltage, a common mode choke coil (CMCC) 15 for reducing common mode noise flowing into the communication LSI 2, and electrostatic protection elements 17P and 17N for avoiding electrostatic damage are disposed. The electrostatic protection elements 17P and 17N are connected between the P-side and N-side signal lines 6 and 7 and a ground potential point (which will hereinafter be referred to as "GND"). P or N appended to the tail of each reference number indicates connection to the P-side signal line 6 or to the N-side signal line 7, respectively.

It should be noted that the constituent elements connected between the communication LSI 2 and the cable connector 16, as shown in FIG. 1, make up a general circuit configuration to which other constituent elements may be added, and that some of components described herein may not be included in these constituent elements. Components other than the constituent elements shown in FIG. 1 include, for example, a common mode termination, a filter, and a power superimposition filter.

According to the electronic device 1 of this embodiment, in the differential transmission path 5 connecting the cable connector 16 to the CMCC 15, the P-side signal line 6 and the N-side signal line 7 have a capacitive load mechanism 18P and a capacitive load mechanism 18N, respectively, the capacitive load mechanisms 18P and 18N being located between the P-side signal line 6 and N-side signal line 7 and the GND. The capacitive load mechanisms 18P and 18N are connected to the GND as an example. In a different example, like an example shown in FIG. 4 to be described later, the capacitive load mechanisms 18P and 18N are not connected to the GND, that is, connected only to the P-side signal line 6 and the N-side signal line 7.

The capacitive load mechanisms 18P and 18N have capacitances asymmetric with each other, that is, different from each other, respectively. Specific examples of the capacitive load mechanisms 18P and 18N will be described later.

A representative value indicating the EMC performance of the electronic device 1 is a mode conversion loss. From the cable connector 16, whether an Scd value measured by using a network analyzer is smaller than a target value is checked. Based on the check result, whether the EMC performance is acceptable can be determined. One example of such an electronic device is an autonomous driving electronic control unit (AD-ECU) of an automobile.

Figure 2:
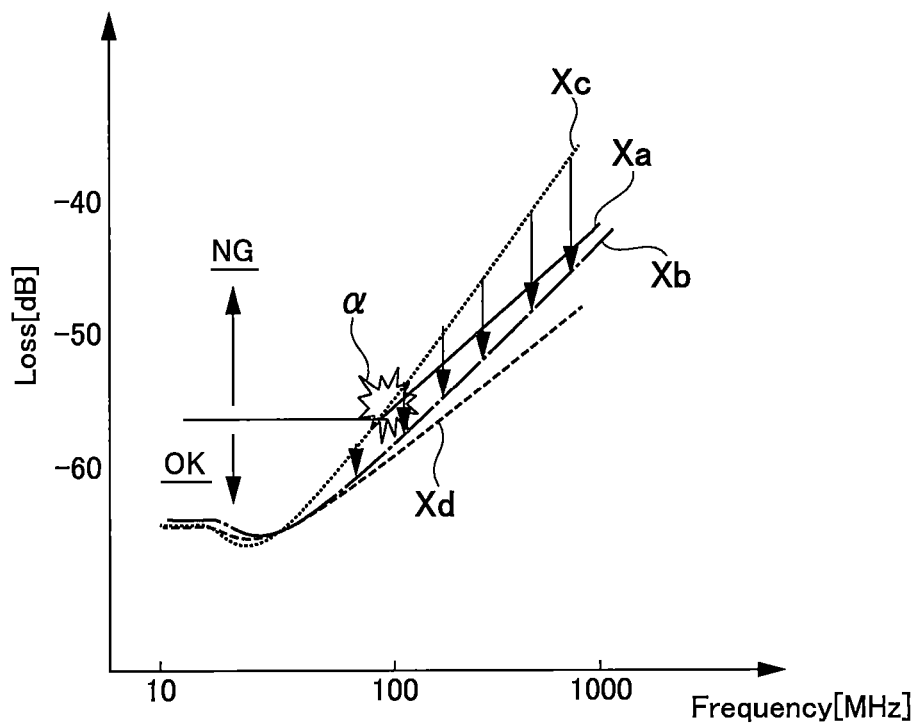
FIG. 2 is a characteristic graph showing an effect achieved by the first embodiment of the present invention.

FIG. 2 depicts an example of mode conversion loss performance. In FIG. 2, the horizontal axis represents frequency [MHz] and the vertical axis represents mode conversion loss [dB]. For the mode conversion loss, a target value Xa is determined for each frequency. In this example, a design-wise mode conversion loss of a certain electronic device is set such that a characteristic value Xd in a case of component characteristics variation not existing remains equal to or smaller than the target value Xa in any frequency band.

A case is considered where, for example, variations in parasitic capacitances of the electrostatic protection elements 17P and 17N occur, the electrostatic protection elements 17P and 17N being among components connected to the differential transmission path. When such component characteristics variations occur, the mode conversion loss increases, in which case a characteristic value Xc in a case of component characteristics variation existing may exceed the target value Xa in a range of frequencies equal to or higher than a specific frequency α.

In this embodiment, the mode conversion loss is reduced using the capacitive load mechanism 18P and capacitive load mechanism 18N connected to the P-side signal line 6 and N-side signal line 7. For example, when the parasitic capacitance of the electrostatic protection element 17P is larger than the parasitic capacitance of the electrostatic protection element 17N, the capacitive load mechanisms 18P and 18N are given capacitances made asymmetric in such a way as to cancel a parasitic capacitance difference corresponding to the difference between the parasitic capacitance of the electrostatic protection element 17P and the parasitic capacitance of the electrostatic protection element 17N. As a result, as shown in FIG. 2, the characteristic value Xc in the case of component characteristics variation existing is corrected to an adjusted characteristic value Xb, which creates a state of the mode conversion loss being suppressed, thus meeting the requirement of the characteristic value remaining equal to or lower than the target value Xa.

Figure 3:
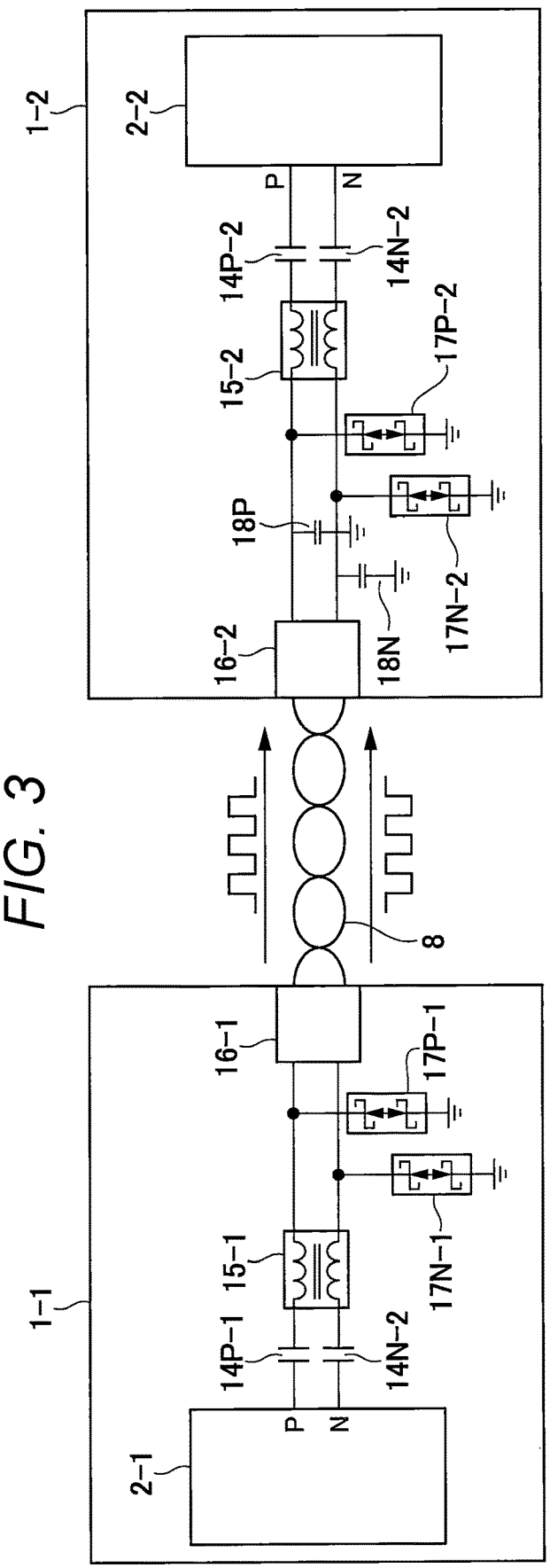
FIG. 3 is a configuration diagram showing an example of an overall signal transmission system according to the first embodiment of the present invention.

FIG. 3 depicts a configuration of an example of an overall signal transmission system including the electronic device 1 shown in FIG. 1.

The transmission system shown in FIG. 3 is a transmission system in which an electronic device 1-2 on the right corresponds to the electronic device 1 shown in FIG. 1 and this electronic device 1-2 is connected to an external different electronic device 1-1 through a twisted-pair cable 8.

The electronic devices 1-1 and 1-2 have cable connectors 16-1 and 16-2, respectively, to which the twisted-pair cable 8 is connected.

The electronic device 1-1 and the electronic device 1-2 include, as internal components, a communication LSI 2-1 and a communication LSI 2-2, AC coupling capacitors 14P-1 and 14 N-1 and AC coupling capacitors 14P-2 and 14N-2, a common mode choke coil (CMCC) 15-1 and a common mode choke coil (CMCC) 15-2, and electrostatic protection elements 17P-1 and 17N-1 and electrostatic protection elements 17P-2 and 17N-2, respectively.

The electronic device 1-2 further includes the capacitive load mechanisms 18P and 18N described with reference to FIG. 1.

The configuration shown in FIG. 3 offers a feature that an improvement in noise resistance to radiation resulting from signal transmission from the electronic device 1-2 through a cable and to external common mode noise generated at the electronic device 1-2 can be achieved through adjustment by the capacitive load mechanisms 18P and 18N. In the configuration shown in FIG. 3, the capacitive load mechanisms are provided in the electronic device 1-2 only. However, by providing the capacitive load mechanisms 18P and 18N also in the electronic device 1-1, the EMC performance of the system as a whole can be further improved.

Figure 4:
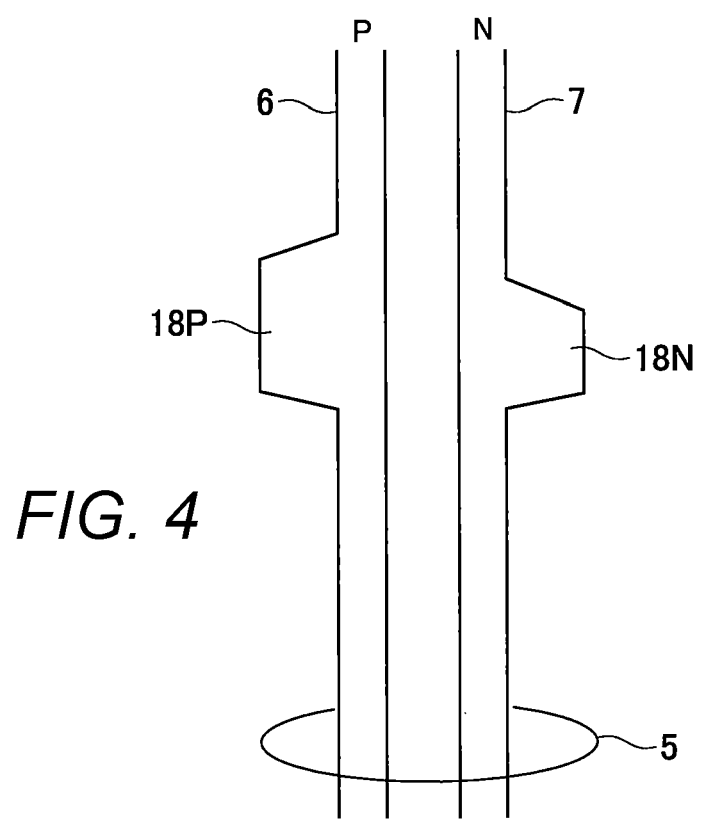
FIG. 4 is a top view of an example of a mounting pattern according to the first embodiment of the present invention.

FIG. 4 is a top view showing an example of mounting of the capacitive load mechanisms 18P and 18N.

In the example shown in FIG. 4, the P-side signal line 6 and the N-side signal line N, which make up the differential line 5 on the printed circuit board, are provided respectively with line regions that are parts with greater widths, and these line regions with greater widths serve as the capacitive load mechanisms 18P and 18N.

In the example of FIG. 4, the P-side capacitive load mechanism 18P is made larger than the N-side capacitive load mechanism 18N, which creates an asymmetric structure. This asymmetric structure is an adjusted structure that reduces the mode conversion loss of the electronic device. As shown in FIG. 4, the capacitive load mechanisms 18P and 18N of a simple configuration that are provided on the P-side signal line 6 and N-side signal line 7 can achieve an improvement in noise resistance to external common mode noise. It should be noted that a size ratio between the capacitive load mechanisms and a size relationship between P and N do not necessarily need to follow the one shown in this example and are adjusted in accordance with an actual amount of the mode conversion loss of the transmission system.

Second Embodiment

Figure 5:
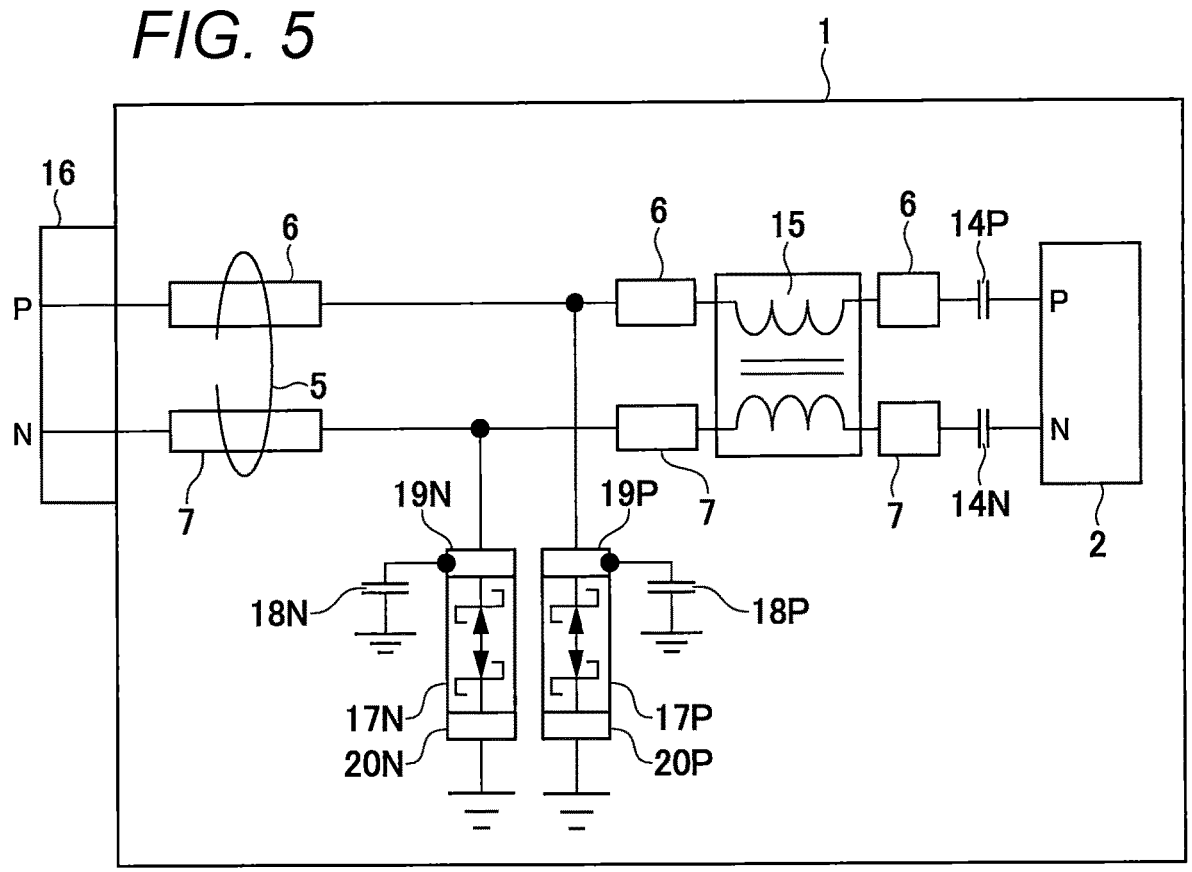
FIG. 5 is a circuit diagram according to a second embodiment of the present invention.

FIG. 5 depicts a configuration of an electronic device 1 with a signal transmission system according to a second embodiment of the present invention.

In the same manner as the electronic device 1 shown in FIG. 1, the electronic device 1 shown in FIG. 5 is connected to a cable via the cable connector 16 and is connected to an external different electronic device to perform signal transmission. The electronic device 1 of FIG. 5 is the same as the electronic device 1 of FIG. 1 also in that the communication LSI 2 for communication is connected to the cable connector 16 through the differential line 5 laid out on the printed circuit board and that the differential line 5 is composed of the pair of the P-side signal line 6 and the N-side signal line 7.

Furthermore, the electronic device 1 of FIG. 5 is the same as the electronic device 1 of FIG. 1 also in that the AC coupling capacitors 14P and 14N for cutting off DC voltage, the common mode choke coil 15 for reducing common mode noise flowing into the communication LSI, and the electrostatic protection elements 17P and 17N for avoiding electrostatic damage are provided between the communication LSI 2 and the cable connector 16.

The electrostatic protection elements 17P and 17N shown in FIG. 5 are mounted on component mounting electrodes 19P and 20P and component mounting electrodes 19N and 20N, respectively, the component mounting electrodes 19P and 19N being on the signal line side and the component mounting electrodes 20P and 20N being on the GND side.

In this configuration, one of mode conversion losses with a large degree of influence, the mode conversion losses being observed from the cable connector 16, is variations in the parasitic capacitances of the electrostatic protection elements 17P and 17N.

In this embodiment, the capacitive load mechanisms 18P and 18N are annexed to component electrodes of the electrostatic protection elements 17P and 17N, the component electrodes being close to the signal lines 6 and 7 of the differential line 5.

In this configuration, the capacitive load mechanisms 18P and 18N are connected to extension lines from the signal line side electrodes of the electrostatic protection elements 17P and 17N and are located between the signal line side electrodes and the ground.

As a signal frequency gets higher, bringing a balance adjustment point closer to the transmission path becomes more important. For this reason, annexing the capacitive load mechanisms 18P and 18N to the component electrodes, as shown in FIG. 5, is highly effective in improving performance in a high frequency band. When the balance adjustment point is brought closer to the transmission path, a proper distance to the transmission path is determined to be about ⅟₂₀ of a signal wavelength. For example, when a signal has a frequency component of 10 GHz, its wavelength on the printed circuit board is about 15 mm, in which case the distance given by multiplying 15 mm by ⅟₂₀ is 0.75 mm. This indicates the high necessity of annexing the capacitive load mechanisms 18P and 18N to the component electrodes.

Figure 6:
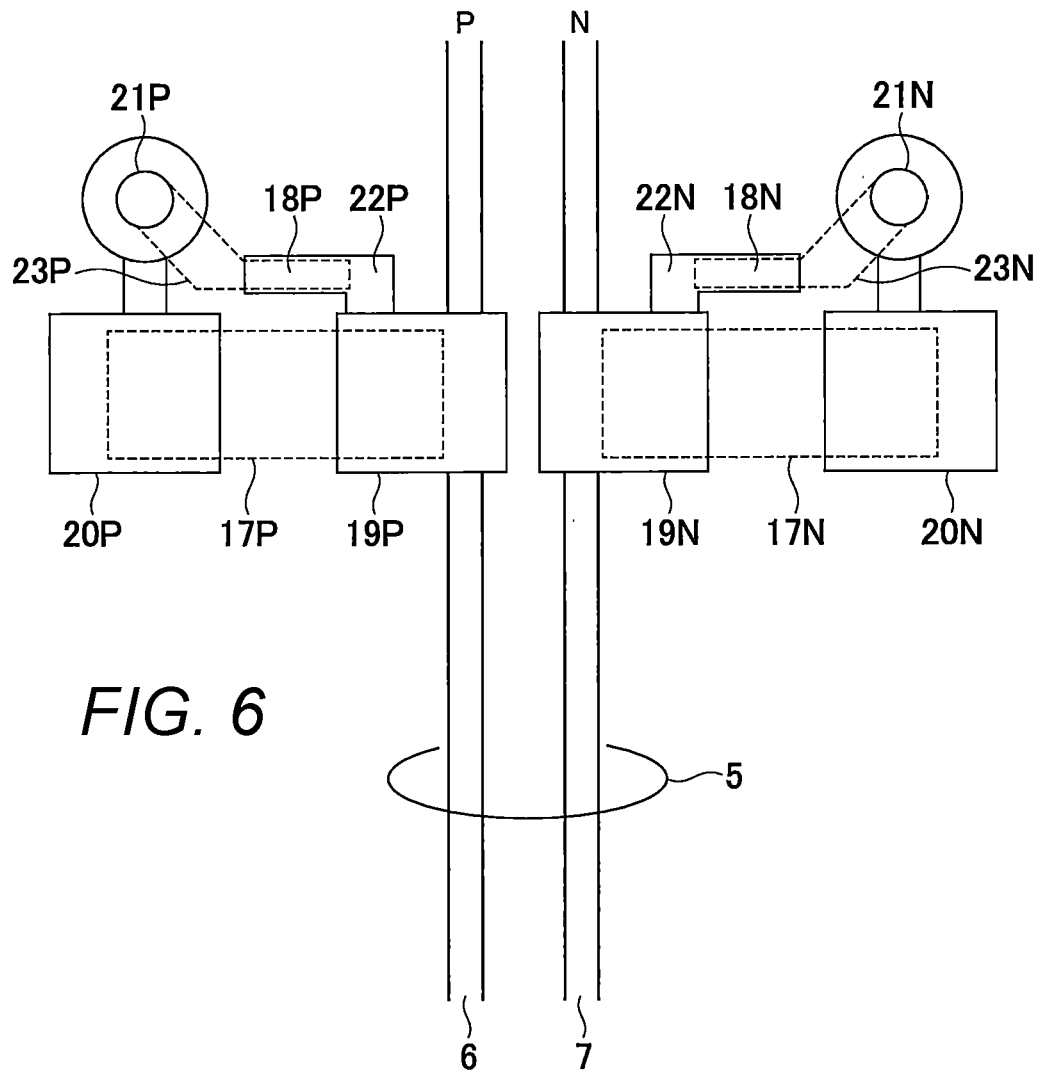
FIG. 6 is a top view showing a mounting pattern according to the second embodiment of the present invention.

FIG. 6 is a top view of the printed circuit board, showing a mounting pattern of the capacitive load mechanisms 18P and 18N according to this embodiment.

In this embodiment, the capacitive load mechanisms are annexed to the electrodes of the electrostatic protection elements 17P and 17N. As shown in FIG. 6, the component mounting electrode 19P and the component mounting electrode 19N are connected to the P-side signal line 6 and the N-side signal line 7 making up the differential line 5, respectively. The component mounting electrodes 20P and 20N on the ground side are provided, and are connected to a ground line layer through VIAs 21P and 21N for GND connection, respectively.

In this configuration, extension lines 22P and 22N are extended out from the signal side electrodes as lines 23P and 23N are extended out from the ground connection VIAs, and parallel plate capacitance parts are formed between the extension lines 22P and 22N and the lines 23P and 23N, respectively, and these parallel plate capacitance parts make up the capacitive load mechanisms 18P and 18N. In this case, a balance adjustment method is adopted by which a part or the whole of the extension lines 22 P and 22 N forming the parallel plate capacitance parts are removed. Therefore, the capacitances of the capacitive load mechanisms 18P and 18N before adjustment do not need to be asymmetric.

FIGS. 7 and 8 depict examples of a mode conversion loss reduction effect that results when balance adjustment is made in the configuration shown in FIG. 6. FIG. 7 shows examples of states of adjustment of the capacitive load mechanisms 18P and 18N, as enlarged views of patterns on the board. FIG. 7A shows a state in which no capacitive load mechanisms is present, and FIG. 7B shows a state in which the capacitive load mechanisms 18P and 18N are formed. FIG. 7C shows a state in which adjustment work performed has removed the N-side capacitive load mechanism 18N but left the P-side capacitive load mechanism 18P as it is.

FIG. 8 depicts an effect that results when the above adjustment is made. In FIG. 8, the vertical axis represents mode conversion loss, and the horizontal axis represents frequency.

For example, a case is considered where the parasitic capacitance of the electrostatic protection element 17P is +5% of a standard value and the parasitic capacitance of the electrostatic protection element 17N is −5% of the standard value, that is, a variation in the parasitic capacitances has occurred. In this case, the variation in the parasitic capacitances of the electrostatic protection elements increases the mode conversion loss, which may cause a characteristic value X1 before adjustment to exceed the target value Xa in a range of frequencies equal to or higher than a specific frequency. The characteristic value X1 before adjustment is the characteristic value in the state in which no capacitive load mechanisms is present, the state being shown in FIG. 7A.

Now, because the parasitic capacitance of the P-side component is +5%, which is larger one, the capacitance on the P-side needs to be reduced to put P and N in a balanced state. Thus, as shown in FIG. 7C, a part Z corresponding to the N-side capacitive load mechanism 18N is removed from the board, which makes the board pattern asymmetric. In this case, the entire part corresponding to the N-side capacitive load mechanism 18N is removed as the part Z to be removed. However, the area of the part Z to be removed may be adjusted to make more precise capacitance adjustment.

FIG. 8 shows characteristics of the mode conversion loss before and after the adjustment shown in FIG. 7C is made.

A characteristic value X2 of the mode conversion loss before capacitance adjustment (the state of FIG. 7B) indicates a characteristic value similar to the original characteristic value X1 in the state of FIG. 7A in which no capacitive load mechanism is present.

Compared with the characteristic value X2, on the other hand, a characteristic value X3 of the mode conversion loss after capacitance adjustment achieves a mode conversion loss improvement Da of about 6 dB, as shown in FIG. 7C, demonstrating that the characteristic value X3 clears the target value Xa.

The characteristics shown in FIG. 8 are obtained by modeling a pattern on the board by an electromagnetic field analysis, demonstrating that the effects can be achieved with a pattern corresponding in size to an actual component electrode.

Third Embodiment

Figure 9A:
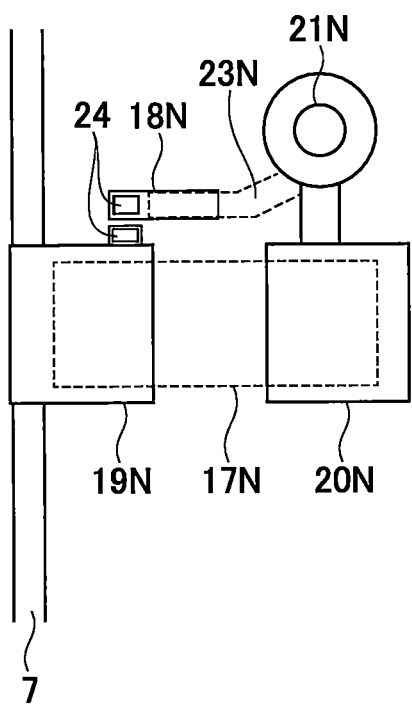
FIG. 9A is a top view of a mounting pattern according to a third embodiment of the present invention.
Figure 9B:
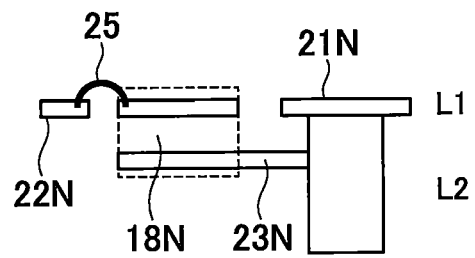
FIG. 9B is a sectional view of the mounting pattern according to the third embodiment of the present invention.

FIG. 9 shows a top view (FIG. 9A) and a sectional view (FIG. 9B) of a mounting pattern on a printed circuit board of an electronic device 1 with a signal transmission system according to a third embodiment of the present invention.

Similar to the second embodiment, the third embodiment provides a configuration in which the capacitive load mechanisms are annexed to the electrodes of the electrostatic protection elements, but this configuration is different from the configuration in which the capacitive load mechanisms are annexed to the electrodes of the electrostatic protection elements in the second embodiment.

In FIG. 9, for simpler description, a configuration of the capacitive load mechanism on the N-side line is shown. It should be noted, however, that the capacitive load mechanism of the same configuration is provided on the P-side line as well. In FIG. 9, a capacitance is formed of a parallel plate between a line pattern on an L1 layer of the printed circuit board and a line pattern on an L2 layer of the same. However, line layers for line patterns making up the parallel plate are chosen arbitrarily.

In this embodiment, as shown in FIG. 9A, the component mounting electrode 19N is connected to the N-side signal line 7. The ground-side component mounting electrode 20N is provided as well and is connected to the ground line layer via the VIA 21N for GND connection. In this configuration, a parallel plate capacitance part is formed between a signal line 18N-L1 of the L1 layer and the line 23N extended out from the ground connection VIA 21N, and this parallel plate capacitance part makes up the capacitive load mechanism 18N.

In the case of the configuration shown in FIG. 9, the mounting electrode 19N and the line 18N-L1 of the L1 layer of the capacitive load mechanism 18N, i.e., the parallel plate is not connected to each other at the beginning. In this case, the following approach is taken. As shown in the sectional view of FIG. 9B, a projection 22N from the electrode 19N is connected to the line part 18N-L1 of the L1 layer of the capacitive load mechanism 18N via a metal connection 25 made of solder or the like. This allows capacitance addition, thus allowing capacitance adjustment.

For this process, as shown in FIG. 9A, an opening 24 is formed on the projection of the electrode 19N and on a surface resist of the line 18 N-L1 of the L1 layer of the capacitive load mechanism 18N. Through these openings 24, the metal connection 25 shown in FIG. 9B electrically connects the projection of the electrode 19N to the L1 layer of the capacitive load mechanism 18N. An advantage this approach offers is that because connecting the capacitive load mechanism is unnecessary in the initial state, a drop in high frequency performance caused by connection of an extra load capacitance can be prevented.

Fourth Embodiment

Figure 10A:
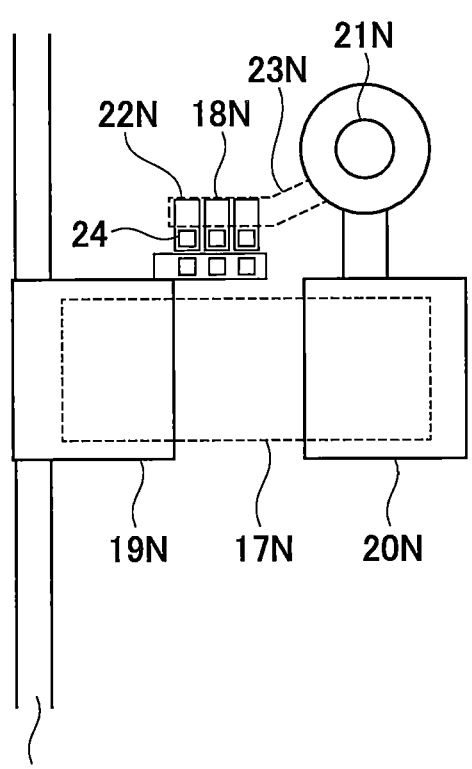
FIG. 10A is a top view of a mounting pattern according to a fourth embodiment of the present invention.
Figure 10B:
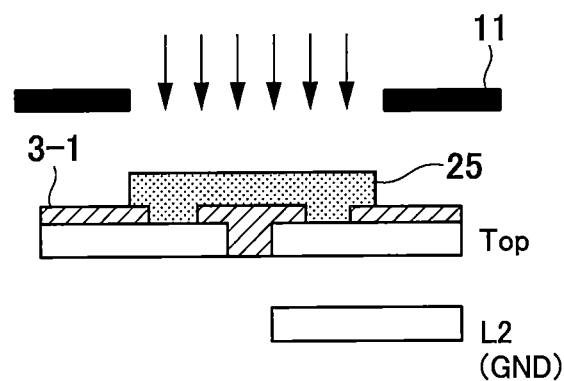
FIGS. 10B and 10C are sectional views showing a manufacturing process according to a fourth embodiment of the present invention.
Figure 10C:
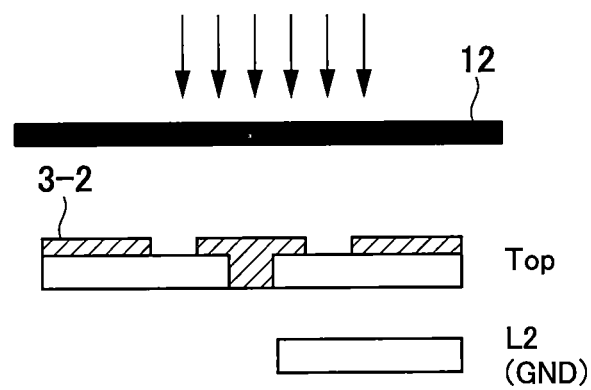

FIG. 10 shows a top view (FIG. 10A) of a mounting pattern on a printed circuit board of an electronic device 1 with a signal transmission system according to a fourth embodiment of the present invention, and sectional views (FIGS. 10B and 10C) showing a manufacturing method for the mounting pattern.

The mounting pattern of the fourth embodiment is a pattern in which the capacitive load mechanism is annexed to the electrode of the electrostatic protection element, which pattern is similar to the above-described mounting pattern of the fourth embodiment (FIG. 9) but is actually a developed form of the mounting pattern of the fourth embodiment.

The mounting pattern of this embodiment shown in FIG. 10A is configured such that the capacitive load mechanism 18N is formed into a comb shape and that a capacitance adjustment amount can be adjusted in fine scale by changing connection points or the number of connections made by comb teeth. Specifically, in the configuration of FIG. 10A, the comb teeth make connection at three points (i.e., the number of connections made by the comb teeth is three), and connection or disconnection is selected at each of the three points. By this adjustment process, the area of the line pattern is increased or decreased and therefore the capacitance adjustment amount can be adjusted in fine scale. Even when the number of connection points remains the same, selecting connection positions allows fine adjustment of the capacitance adjustment amount. Determining the number of connections made by the comb teeth to be three is one example. The number of connections may be determined to be two or four or more.

The mounting pattern of this embodiment is characterized by an approach by which a degree of imbalance is determined by measurement of the transmission path or the like, an amount of fine adjustment for resolving the imbalance is determined, and the number of pattern connections and connection points are determined.

The part other than the comb shape of the mounting pattern shown in FIG. 10A is the same in configuration as the mounting pattern shown in FIG. 9.

FIGS. 10B and 10C are sectional views of the board, showing manufacturing processes of changing connection/non-connection patterns.

FIG. 10B shows a state of manufacturing of connection points of the capacitive load mechanism 18N. In the case of forming a connection pattern, solder transfer is performed at a point not covered with a conductive pattern 3-1, the point being on a surface line layer Top of the board that is the L1 layer, and solder 25 makes the point conductive.

In this case, a mask 11 at a solder transfer position is provided with an opening for solder transfer.

FIG. 10C shows a state of manufacturing of non-connection points of the capacitive load mechanism 18N. In the case of forming a non-connection pattern, a mask 12 is provided with no opening so that solder transfer is not performed at the point not covered with the conductive pattern 3-1, the point being on the surface line layer Top of the board that is the L1 layer.

Such manufacturing processes allow fine adjustment of the capacity adjustment amount.

Figure 11:
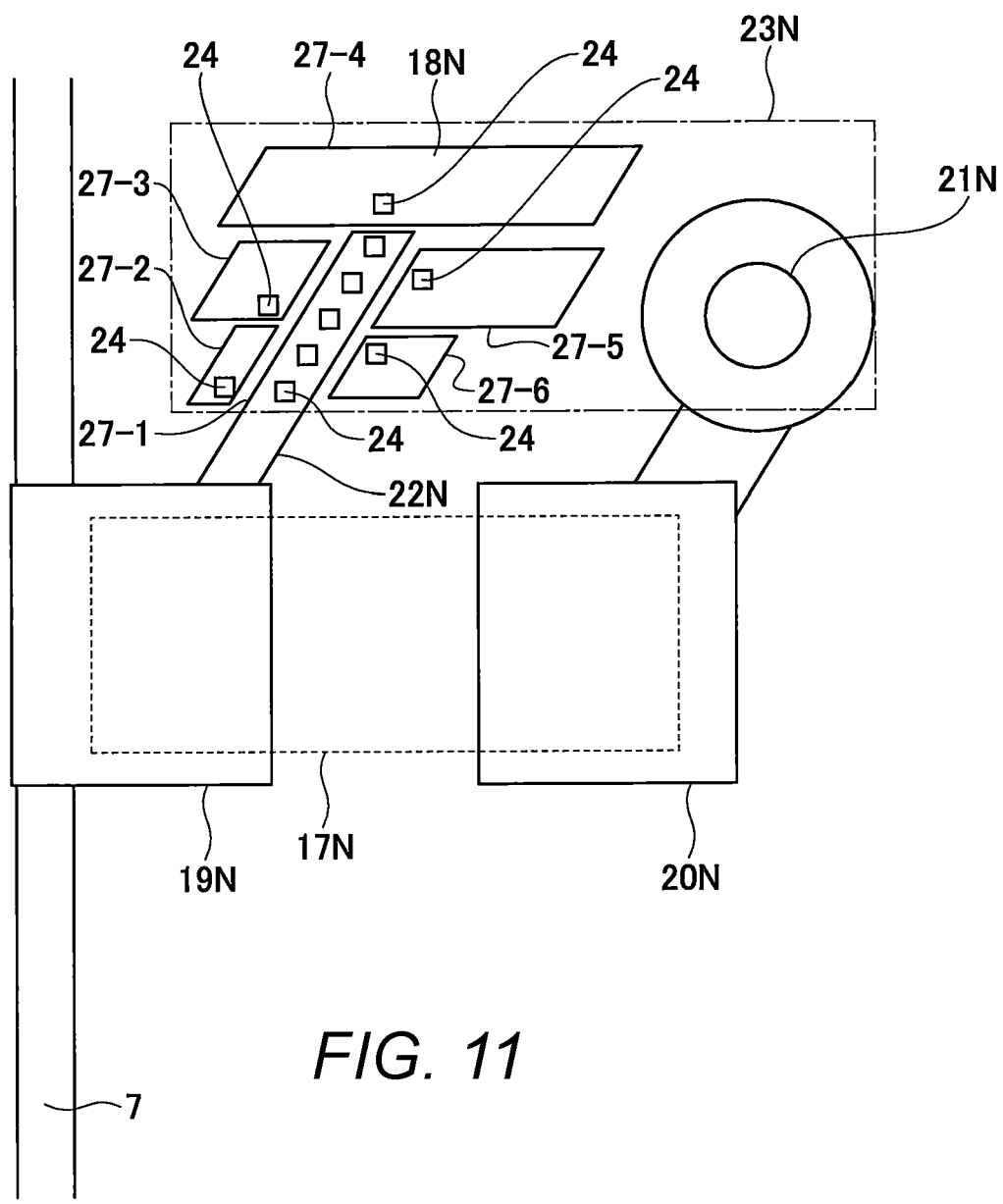
FIG. 11 is a top view of another mounting pattern according to the fourth embodiment of the present invention.

FIG. 11 is a top view of another example of the mounting pattern on the printed circuit board of the electronic device 1 with the signal transmission system according to the fourth embodiment.

In the example of FIG. 11, the component mounting electrode 19N is connected to the N-side signal line 7, as is in the example of FIG. 10. On the ground side, the component mounting electrode 20N is connected to the ground line layer via the VIA 21N for GND connection, and the electrostatic protection element 17N is connected to the component mounting electrode 19N and to the component mounting electrode 20N on the ground side. This is the same configuration as shown in the example of FIG. 10A.

The line 23N extended out from the ground connection VIA 21N is formed as the line with a relatively large area on the L2 layer of the board, and the capacitive load mechanism 18N is configured on the L1 layer of the board that overlaps the ground line 23 N with the large area. The capacitive load mechanism 18N in the example of FIG. 11 includes a number of independent conductive patterns 27-1 to 27-6 arranged on the L1 layer, and the conductive pattern 27-1, which is one of the independent conductive patterns, is connected to the projection 22N from the electrode 19N. The conductive patterns 27-2 to 27-6 are not directly connected to the electrode 19N. The conductive patterns 27-1 to 27-6 each vary in size and are laid out such that the conductive patterns 27-2 to 27-6 are arranged around the conductive pattern 27-1 connected to the electrode 19N. Each of the conductive patterns 27-1 to 27-6 has at least one opening 24, and the conductive pattern 27-1 connected to the electrode 19N has a plurality of openings 24.

In this configuration, when the capacitance of the capacitive load mechanism 18N is adjusted, the solder 25 (FIG. 10) is transferred to any one of the openings 24 to obtain an intended capacitance adjustment value.

As shown in FIG. 11, by giving the capacitive load mechanism 18N the shape having a number of conductive patterns 27-1 to 27-6, a more proper capacitance adjustment value can be obtained.

It should be noted that the shape of the capacitive load mechanism 18N is not limited to the shapes of the capacitive load mechanism 18N that are shown in FIGS. 10A and 11, providing that the shape of the capacitive load mechanism 18N allows capacitance value adjustment by soldering work or the like.

Fifth Embodiment

Figure 12:
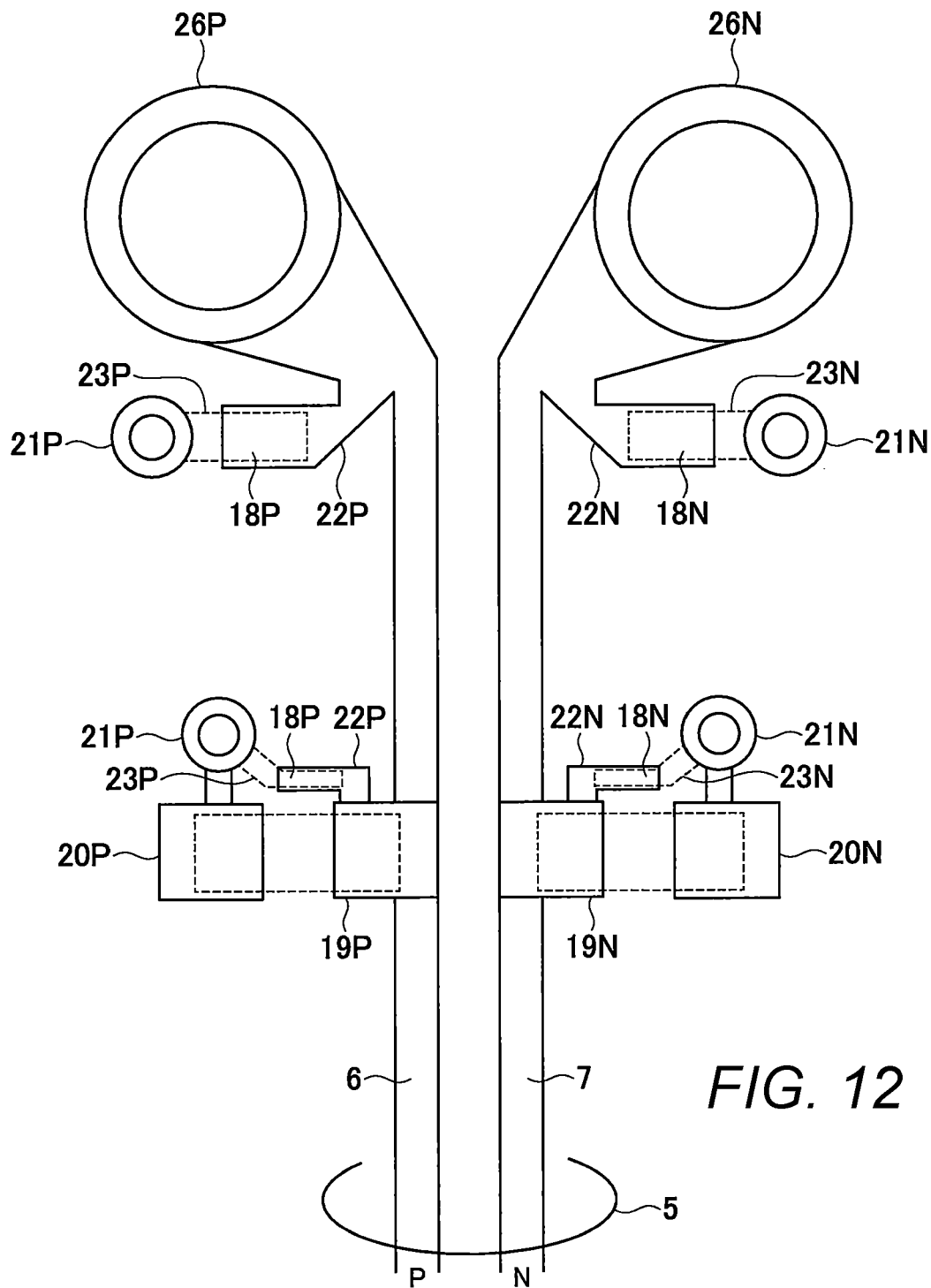
FIG. 12 is a top view of a mounting pattern according to a fifth embodiment of the present invention.

FIG. 12 is a top view of a mounting pattern on a printed circuit board of an electronic device 1 with a signal transmission system according to a fifth embodiment of the present invention.

The mounting pattern of the fifth embodiment has the configuration of annexing the capacitive load mechanism to the electrode of the electrostatic protection element, the configuration being described in the second embodiment, and a configuration of allowing fine adjustment of a characteristic difference between P and N at the cable connector 16 as well.

As described with reference to FIG. 6, the component mounting electrode 19P and component mounting electrode 19N are connected to the P-side signal line 6 and N-side signal line 7 making up the differential line 5, respectively, and the component mounting electrodes 20P and 20N are provided on the ground side. The extension lines 22P and 22N are extended out from the signal side electrodes 19P and 19N as the lines 23P and 23N are extended out from the ground connection VIAs 21P and 21N, and parallel plate capacitance parts are formed between the extension lines 22P and 22N and the lines 23P and 23N, respectively, and these parallel plate capacitance parts make up the capacitive load mechanisms 18P and 18N. This is the configuration described above with reference to FIG. 6.

According to this embodiment, as shown in FIG. 12, the capacitive load mechanisms 18P and 18N are annexed to the vicinity of electrodes of connection pits 26P and 26N of the board to which the cable connector 16 (FIG. 1) is connected. In this case, the cable connector is mounted on the printed circuit board by press fitting, which means that the cable connector is a press-fit connector. The press-fit connector is mounted such that its P-side signal terminal and N-side terminal are inserted respectively into the connection pits 26P and 26N of the board to establish electrical connection. In this configuration, a set of the capacitive load mechanisms 18P and 18N disposed in the middle of the P-side signal line 6 and the N-side signal line 7 can improve characteristics of resistance to external common mode noise, and another set of the capacitive load mechanisms 18P and 18N on a connection part of the cable connector 16 too can improve characteristics of resistance to external common mode noise. Hence better characteristics are achieved.

The extension lines 22P and 22N are connected to the electrodes of the connection pits 26P and 26N as the lines 23P and 23N are extended out from the ground connection VIAs 21P and 21N, and the parallel plate capacitance parts are formed between the extension lines 22P and 22N and the lines 23P and 23N, respectively, to make up the capacitive load mechanisms 18P and 18N. In this case, balance adjustment is made by removing a part or the whole of the extension lines 22P and 22N forming the parallel plate parts. Two extension lines 22P and 22N forming two capacitive load mechanisms 18P and 18N can be adjusted independently, and independently adjusting these extension lines 22P and 22N allows adjustment to capacitance values with proper asymmetry.

In the example of FIG. 12, a set of the capacitive load mechanisms 18P and 18N are disposed in the middle of the P-side signal line 6 and the N-side signal line 7, and another set of the capacitive load mechanisms 18P and 18N are disposed on the connection part of the cable connector 16. However, while the capacitive load mechanisms 18P and 18N are disposed on the connection part of the cable connector 16, the capacitive load mechanisms 18P and 18N in the middle of the P-side signal line 6 and the N-side signal line 7 may be omitted. Even when the capacitive load mechanisms 18P and 18N in the middle of the P-side signal line 6 and the N-side signal line 7 are omitted, the capacitive load mechanisms 18P and 18N close to the electrodes of the connection pits 26P and 26N for connection to the cable connector 16 are adjusted independently to provide capacitance values with proper asymmetry. This allows an improvement in noise resistance to external common mode noise.

[Range of Capacitance Values of Capacitive Load Mechanisms in Each Embodiment]

An example of a range of the capacitance values of the capacitive load mechanisms 18P and 18N described above will be described.

In a high-speed transmission system, a load capacitance is the cause of attenuation of a high-frequency signal and therefore should preferably be small. For example, in many cases, the parasitic capacitance of a component used for signal transmission at a transmission rate of 1 Gbps or higher is 3 pF or less. Similarly, the parasitic capacitance of an oscilloscope for waveform evaluation is kept at 1 pF to 3 pF or less.

In signal transmission at a transmission rate higher than 10 Gbps, a parasitic capacitance limit value ranges from 0.1 pF to 0.05 pF. It is assumed that a capacitance variation, which is the cause of mode conversion loss, corresponds to about +/−10% of the parasitic component of a component. It follows from this assumption that a parasitic capacitance variation of a component for signal transmission at a transmission rate higher than 1 Gbps is about 3 pF×+/−10%=+/−0.3 pF. This leads to a conclusion that the transmission system discussed herein needs capacitance adjustment of adjusting +/−0.3 pF at the maximum. In an assumed case of signal transmission at 10 Gbps or so, the parasitic capacitance variation is calculated at about 0.05 pF×+/−10%=+/−0.005 pF. In this case, fine capacitance adjustment of adjusting up to +/−0.005 pF is highly effective. Summing up these insights leads to a conclusion that the range of capacitance adjustment of the capacitive load mechanisms 18N and 18P should preferably be from 0.005 pF to 0.3 pF.

REFERENCE SIGNS LIST 1-1, 1-2 electronic device
2, 2-1, 2-2 communication LSI
5 differential line
6 P-side signal line
7 N-side signal line
8 twisted-pair cable
11, 12 mask
14N, 14P, 14N-1, 14N-2, 14P-1, 14P-2 AC coupling capacitor
15 common mode choke coil
15-1 common mode choke coil
16, 16-1, 16-2 cable connector
17N, 17P, 17N-1, 17N-2, 17P-1, 17P-2 electrostatic protection element
18N, 18P capacitive load mechanism
19N, 19P electrode
20N, 20P component mounting electrode
21N, 21P ground connection VIA
22N projection
23N, 22P line
23P line
24 opening
25 metal connection (solder)
26P connection pit
27-1 to 27-6 conductive pattern

The invention claimed is:
1. A signal transmission system comprising:
a first signal line and a second signal line each making up a differential line;
a first capacitive load mechanism disposed in a first region connected to the first signal line, the first capacitive load mechanism having a first capacitance value; and
a second capacitive load mechanism disposed in a second region connected to the second signal line, the second capacitive load mechanism having a second capacitance value asymmetric with the first capacitance value,
wherein the first capacitive load mechanism is a first electrode that is electrically connected to the first signal line and that is formed of a line pattern on a printed circuit board, and the second capacitive load mechanism is a second electrode that is electrically connected to the second signal line and that is formed of a line pattern on a printed circuit board.

2. The signal transmission system according to claim 1, wherein the first capacitive load mechanism is disposed on the first signal line, and the second capacitive load mechanism is disposed on the second signal line.

3. The signal transmission system according to claim 2, wherein the first capacitance value and the second capacitance value are determined by adjusting respective widths of line parts with a greater width, the line parts being locally provided on part of the first signal line and the second signal line, respectively.

4. The signal transmission system according to claim 1, wherein the first capacitive load mechanism is disposed close to the first signal line, and the second capacitive load mechanism is disposed close to the second signal line.

5. The signal transmission system according to claim 1, wherein the first electrode is a first electrode pattern that is additionally formed on a mounting electrode of a first component connected between the first signal line and a ground point line, and the second electrode is a second electrode pattern that is additionally formed on a mounting electrode of a second component connected between the second signal line and the ground point line.

6. The signal transmission system according to claim 5, wherein the first capacitance value and the second capacitance value are adjusted by increasing or decreasing areas of the line patterns, respectively.

7. The signal transmission system according to claim 1, wherein a capacitance adjustment range of the capacitive load mechanism is from 0.005 pF to 0.3 pF.

8. The signal transmission system according to claim 5, wherein an opening is formed on a connection part of the first electrode pattern and on a connection part of the first electrode.

9. The signal transmission system according to claim 5, wherein the first electrode pattern and/or the second electrode pattern is of a comb teeth shape.

10. The signal transmission system according to claim 1, wherein the first signal line is connected to a first electrode for cable connector, the second signal line is connected to a second electrode for cable connector, the first capacitive load mechanism is connected between the first electrode for cable connector and a ground point line, and the second capacitive load mechanism is connected between the second electrode for cable connector and the ground point line.

11. The signal transmission system according to claim 1, wherein the first signal line is connected to a first electrode for cable connector, the second signal line is connected to a second electrode for cable connector, a third capacitive load mechanism is provided between the first electrode for cable connector and a ground point line, and a fourth capacitive load mechanism is provided between the second electrode for cable connector and the ground point line.

12. A signal transmission system comprising:

a first signal line and a second signal line each making up a differential line;

a first capacitive load mechanism disposed in a first region connected to the first signal line, the first capacitive load mechanism having a first capacitance value; and a second capacitive load mechanism disposed in a second region connected to the second signal line, the second capacitive load mechanism having a second capacitance value asymmetric with the first capacitance value, the first signal line is connected to a first electrode for cable connector, the second signal line is connected to a second electrode for cable connector, a third capacitive load mechanism is provided between the first electrode for cable connector and a ground point line, and a fourth capacitive load mechanism is provided between the second electrode for cable connector and the ground point line, and wherein the third capacitive load mechanism and the fourth capacitive load mechanism are adjusted independently.

* * * * *